(12) United States Patent
Nishimura

(10) Patent No.: US 7,332,699 B2
(45) Date of Patent: Feb. 19, 2008

(54) FEED-FORWARD METHODS AND APPARATUS FOR SETTING THE LIGHT INTENSITIES OF ONE OR MORE LEDS

(75) Inventor: Ken A. Nishimura, Fremont, CA (US)

(73) Assignee: Avago Technologies ECBU IP (Singapore) PTE Ltd, Singapore (SG)

( * ) Notice: Subject to any disclaimer, the term of this patent is extended or adjusted under 35 U.S.C. 154(b) by 114 days.

(21) Appl. No.: 10/897,892

(22) Filed: Jul. 23, 2004

(65) Prior Publication Data
US 2006/0016959 A1  Jan. 26, 2006

(51) Int. Cl.
*G01J 1/32* (2006.01)
*G01J 1/44* (2006.01)
*H01J 5/16* (2006.01)
*G05F 1/00* (2006.01)

(52) U.S. Cl. .................. 250/205; 250/226; 250/214 R; 315/307

(58) Field of Classification Search .............. 250/226, 250/205, 216, 370.08, 206, 214 R; 315/291, 315/294, 151, 307
See application file for complete search history.

(56) References Cited

U.S. PATENT DOCUMENTS

| | | | |
|---|---|---|---|
| 5,614,715 A * | 3/1997 | Jones et al. .................. 250/334 |
| 6,359,918 B1 * | 3/2002 | Bielas ....................... 372/38.01 |
| 6,448,550 B1 | 9/2002 | Nishimura | |
| 6,596,977 B2 * | 7/2003 | Muthu et al. ................ 250/205 |
| 2005/0093488 A1 * | 5/2005 | Hung et al. .................. 315/307 |
| 2005/0218838 A1 * | 10/2005 | Lys ............................ 315/291 |

OTHER PUBLICATIONS

Semiconductor Devices. Apr. 18, 2002. http://www.mtmi.vu.lt/pfk/funkc_dariniai/diod/p-n_devices.htm.*

* cited by examiner

*Primary Examiner*—Thanh X. Luu
*Assistant Examiner*—Pascal M Bui-Pho

(57) ABSTRACT

In one method, an operating current of an LED is varied and, at one or more values of the operating current, a corresponding voltage of the LED is measured. The measured voltages are then used as feed-forward variables to set the light intensity of the LED. In another method, an operating current of an LED is modified in a predetermined manner near its nominal operating value. At two or more values of the operating current, a corresponding voltage of the LED is measured. The measured voltages are then used as feed-forward variables to set the light intensity of the LED. Additional methods, as well as apparatus for performing these and other methods, are also disclosed.

26 Claims, 3 Drawing Sheets

FEED-FORWARD METHODS AND APPARATUS FOR SETTING THE LIGHT INTENSITIES OF ONE OR MORE LEDS

BACKGROUND

Temperature, aging and other factors can lead to a shift in the intensity of light emitted by a light emitting diode (LED). When a light source is formed from a plurality of LEDs, shifts in the intensities of the light source's individual LEDs can lead to a shift in the light source's color point. A shift in a light source's color point may be especially noticeable when LEDs producing light of different wavelengths (e.g., red, green and blue LEDs) are used to create a light source of predetermined spectral balance (e.g., a white light source). U.S. Pat. No. 6,448,550 of Nishimura, entitled "Method and Apparatus for Measuring Spectral Content of LED Light Source and Control Thereof", discloses how to 1) measure the spectral content of an LED light source using one or more photosensors, and then 2) alter the operating current(s) of one or more of the light source's LEDs in response to the measured spectral content, to thereby maintain the light source's color point.

SUMMARY OF THE INVENTION

In one embodiment, an operating current of an LED is varied and, at one or more values of the operating current, a corresponding voltage of the LED is measured. The measured voltages are then used as feed-forward variables to set the light intensity of the LED.

In another embodiment, an operating current of an LED is modified in a predetermined manner near its nominal operating value. At two or more values of the operating current, a corresponding voltage of the LED is measured. The measured voltages are then used as feed-forward variables to set the light intensity of the LED.

In yet another embodiment, a reverse current is applied to an LED, subject to a measured voltage of the LED reaching a compliance voltage. At the reverse current, a reverse voltage of the LED is measured. The lesser of the magnitude of the reverse voltage or compliance voltage of the LED is then used as a feed-forward variable to set a light intensity of the LED.

In another embodiment, apparatus comprises a plurality of LEDs of different colors that, when operated, generate a mixed light. At least one of the LEDs is associated with a current sensor, a voltage sensor and control circuitry. The current sensor measures an operating current supplied to the LED. The voltage sensor measures a voltage of the LED. The control circuitry is coupled to the LED and sensors, and is operable to set an operating current of the LED in response to acquired readings from the current and voltage sensors.

Other embodiments are also disclosed.

BRIEF DESCRIPTION OF THE DRAWINGS

Illustrative and presently preferred embodiments of the invention are illustrated in the drawings, in which.

DETAILED DESCRIPTION

Figure 1:
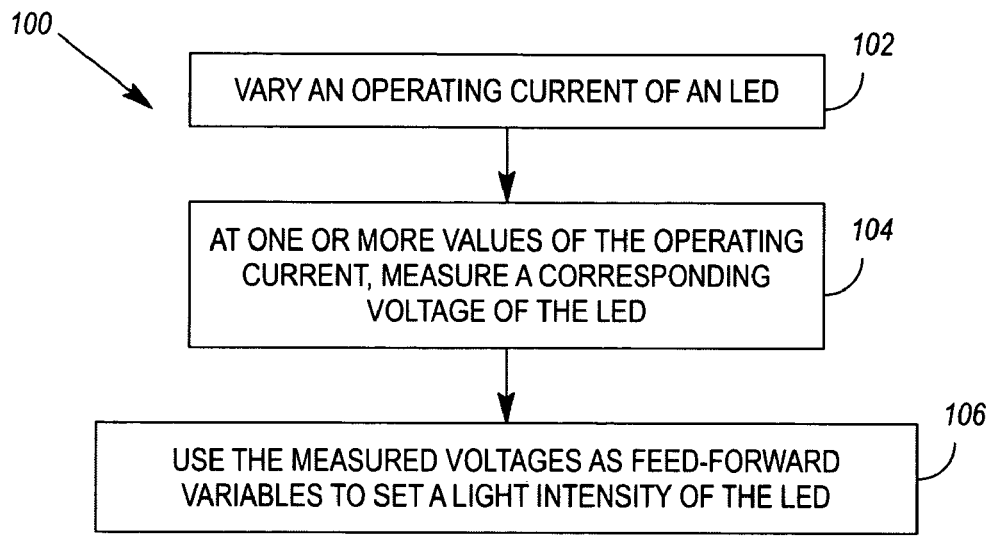
FIG. 1 illustrates a first exemplary feed-forward method for setting the light intensity of an LED.
Figure 2:
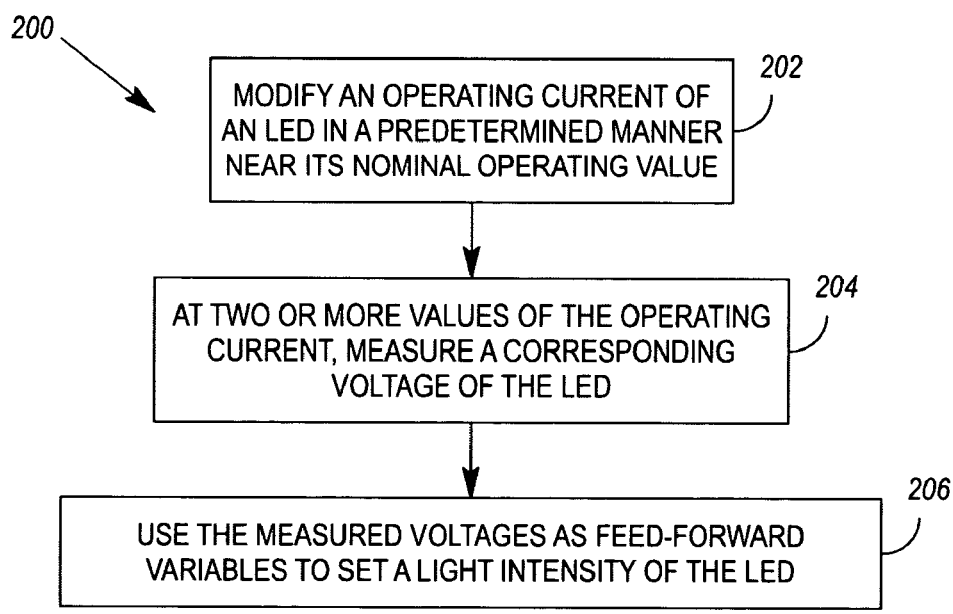
FIG. 2 illustrates a second exemplary feed-forward method for setting the light intensity of an LED.
Figure 3:
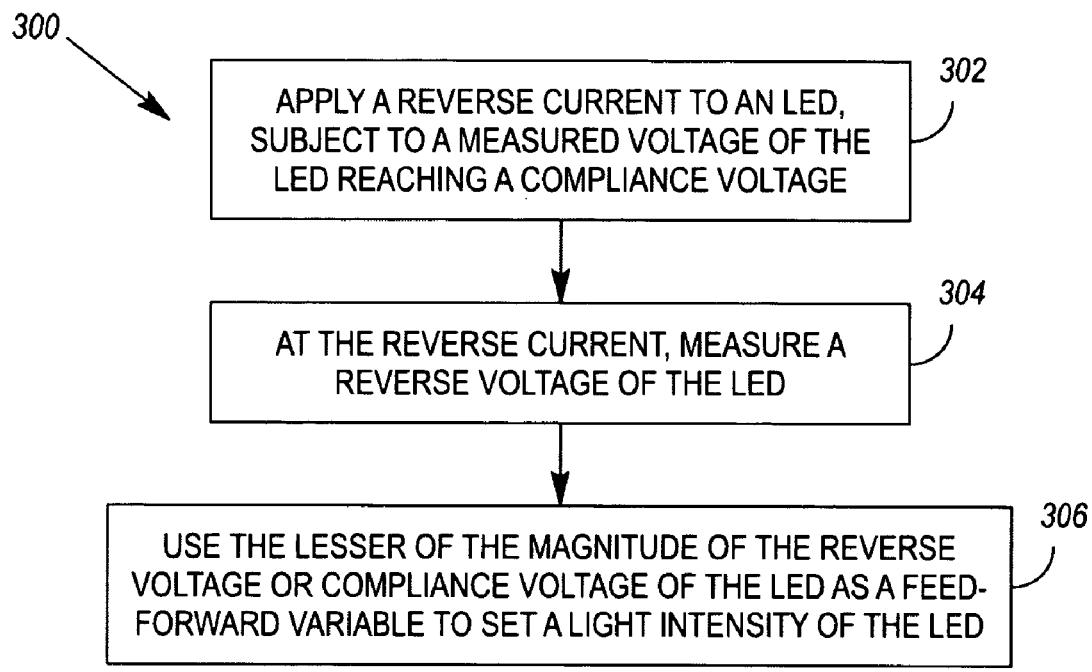
FIG. 3 illustrates a third exemplary feed-forward method for setting the light intensity of an LED.
Figure 4:
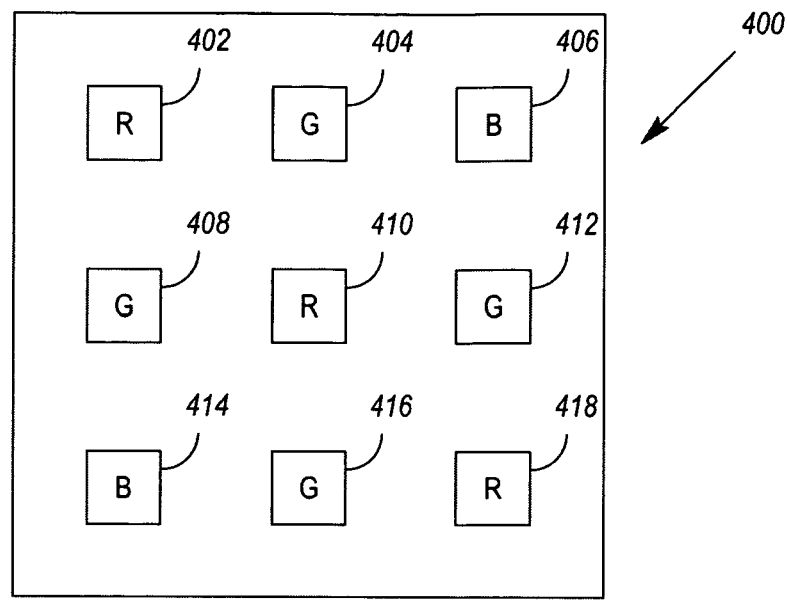
FIGS. 4 & 5 illustrate exemplary apparatus that may implement various methods for setting the light intensity of an LED, or the color point of an LED light source.
Figure 5:
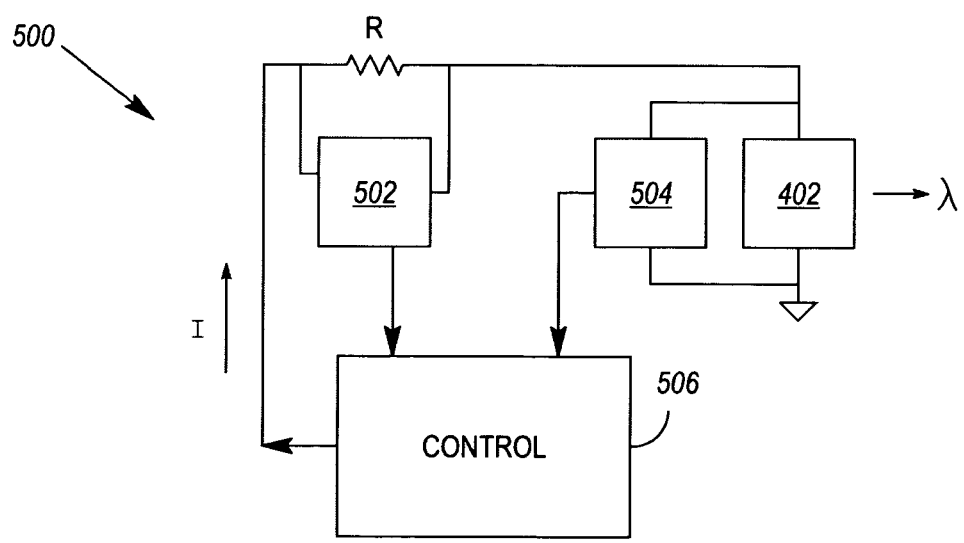

A shift in the intensity of light emitted by an LED may be precipitated by factors such as a change in temperature of the LED's junction, or aging effects. Previously, these shifts have been accounted for by using a photosensor to sense the LED's light, and then regulating the LED's operating current in response to the sensed light. The sensed light therefore provides "feedback" for controlling the LED's operating current and, as a consequence, the LED's light intensity. While such a system is effective, there are times when implementing the photosensor required to sense the LED's light is just too costly, too complex, or impractical to implement. FIGS. 1-3 therefore illustrate various "feed-forward" methods for setting the light intensity of an LED, and FIGS. 4 & 5 illustrate the use of these methods to set the color point of an LED light source (e.g., a display 400).

It is known that the voltage at which an LED starts to conduct appreciable current (i.e., its turn-on voltage), as well as the LED's dynamic impedance, are functions of the LED's junction temperature and aging effects. The LED's turn-on voltage and/or dynamic impedance may therefore be used to closely predict the intensity of light emitted by an LED as a function of its operating current. This prediction can then be used to set the light intensity of an LED. In this manner, an LED's light output is regulated in a "feed-forward" fashion, thereby eliminating the need for a photosensor (although an LED's light output could certainly be regulated by a combination of both feedback and feed-forward methods). In an LED light source comprised of a plurality of LEDs (including light sources comprised of LEDs producing light of different wavelengths), the feed-forward regulation of one or more of the light source's LEDs can further be used to set the color point of the light source.

FIG. 1 illustrates a first exemplary feed-forward method 100 for setting the light intensity of an LED. The method 100 comprises varying 102 an operating current of the LED and, at one or more values of the operating current, measuring 104 a corresponding voltage of the LED (e.g., a voltage across the LED). The measured voltages are then used 106 as feed-forward variables to set the light intensity of the LED (e.g., by regulating the LED's operating current).

An LED's operating current may be varied at various times, and in a number of ways. An obvious time at which an LED's operating current may be varied is at initial turn-on (e.g., when an LED's current is ramped from zero to a nominal operating value). For an LED that is incorporated in a raster scanned display (i.e., a display in which LEDs periodically refresh to generate a new image), the LED's operating current can also be varied (e.g., ramped) at the beginning of each raster scan. The operating current of an LED can also be periodically varied during normal operation of the LED. However, in some cases, this could cause a noticeable blinking of the LED, or flicker in a display of which the LED forms a part.

The measured voltages may be variously chosen. A first voltage measurement may be taken at zero current, or at an operating current value representing the onset of an LED's conduction (i.e., at a current corresponding to the LED's "turn-on voltage"). Second and third voltage measurements may be taken at operating current values representing first and second predetermined fractions of the LED's nominal operating current. These second and third voltage measurements may be used to estimate the dynamic impedance of the LED (e.g., $\Delta V/\Delta I=R$; where $\Delta V$ is the difference in two measured voltages of the LED, where $\Delta I$ is the difference in the currents corresponding to the measured voltages, and where R is the LED's dynamic impedance). Given that the second and third voltages may be used to estimate the dynamic impedance of the LED, it is preferable that these voltage measurements be taken at operating current values that are at or near the nominal operating current of the LED. Thus, in one embodiment, the second voltage measurement is taken at an operating current value representing a majority of the LED's nominal operating current, and the third voltage measurement is taken at the LED's nominal operating current. Preferably, the second voltage is measured at an operating current within 20% of the LED's nominal operating current. Even more preferably, the second voltage is measured at an operating current within 2% of the LED's nominal operating current.

FIG. 2 illustrates a second exemplary feed-forward method for setting the light intensity of an LED. The method 200 comprises modifying 202 an operating current of the LED in a predetermined manner near its nominal operating value. At two or more values of said operating current, a corresponding voltage of the LED is measured 204. The measured voltages are then used 206 as feed-forward variables to set the light intensity of the LED.

There are various ways in which an LED's operating current may be modified. One way is by means of a pilot tone that is added to the LED's intended operating current.

In one embodiment, the pilot tone may be a sinusoid of known frequency. In this embodiment, the voltage of the LED may be measured at two or more different phases of the sinusoid, the occurrences of which are known because the sinusoid's frequency is known. Alternatively, the voltage of the LED may be continuously monitored, and the resultant measurement filtered to extract the component whose frequency is that of the pilot tone. The dynamic impedance could then be computed as the amplitude of the extracted voltage component divided by the amplitude of the current variation imparted by the pilot tone. The amplitude of the current variation imparted by the pilot tone can be quite small owing to the relatively high noise immunity of a pilot tone system. Circuits that can be used to monitor the voltage of the LED include lock-in amplifiers, since they can accurately detect a system's reaction to a stimulus if the phase and frequency of the stimulus is known (as in the system described above).

In another embodiment, the pilot tone used to modify an LED's operating current may be a predetermined signal modulated by a pseudo-random bit sequence (PRBS). As with a sinusoid, the PRBS modulated signal may be added to the LED's intended operating current. An advantage of this embodiment is that the apparently random nature of the PRBS signal will remove any "fixed tone" properties from the light generated by the LED. In addition, it is known that increasing the length of the PRBS sequence will give additional noise immunity. Measurement of the dynamic impedance can then be undertaken by correlating the measured voltage of the LED with the PRBS sequence to recover the component of the voltage measurement resulting from the predetermined signal. Computation of the dynamic impedance then comprises dividing the amplitude of the recovered voltage component by the amplitude of the operating current resulting from the addition of the PRBS modulated signal. Although the nature of the PRBS modulated signal is relatively unconstrained, a preferred embodiment would use a simple square wave oscillating between first and second values. Also, the PRBS can be constrained to average to zero over relatively short periods so that its effect on an LED's average light output is minimal.

Preferably, modifications to an LED's operating current are undertaken at a frequency that exceeds a user-recognizable flicker point of the LED or a light source of which the LED forms a part. It is also preferable that operating current modifications be of small magnitude (such as 2% or less of the LED's nominal operating current), again to prevent user-recognizable light flicker.

FIG. 3 illustrates a third exemplary feed-forward method for setting the light intensity of an LED. Given that premature aging or damage to the LED's p-n junction will result in an increase in the reverse leakage current, which in turn affects the LED's light output, the method 300 estimates the leakage current of the LED when the LED is reverse-biased, and then sets the light intensity of the LED in response to this estimation. The method comprises applying 302 a reverse current to an LED, subject to a measured voltage of the LED reaching a compliance limit, Vc. That is, if the measured voltage reaches the compliance limit, the full magnitude of the reverse current may not be applied to the LED. In this manner, when the LED's leakage current is below the applied reverse current, the compliance limit serves to protect the LED from excessive voltage. By way of example, for some LEDs, the reverse current may be on the order of 50 μA (microAmperes), and the compliance limit may be on the order of 15 V (Volts). At the reverse current, a reverse voltage of the LED, Vr, is measured 304. The lesser of the magnitude of the reverse voltage or compliance voltage of the LED (i.e., MIN[Vr, Vc] is then used as a feed-forward variable to set the light intensity of the LED.

FIGS. 4 & 5 illustrate exemplary apparatus 400, 500 that may implement various (i.e., some or all) of the above methods 100, 200, 300 for setting an LED's light intensity. If an LED is part of an LED light source (e.g., a display), the light source's color point can be set by means of setting the light intensities of one or more of the light source's individual LEDs.

By way of example, the apparatus shown in FIGS. 4 & 5 comprises a plurality of LEDs 402-418 producing light of different wavelengths, λ (i.e., different colors, such as red, green and blue). When operated, the lights produced by the LEDs may mix to form light of a predetermined (and possibly dynamic) spectral content (e.g., a white light for backlighting a liquid crystal display (LCD)). At least some of the LEDs (and preferably all of them) are associated with a current sensor 502, a voltage sensor 504 and control circuitry 506. An LED's current sensor 502 measures the operating current supplied to the LED 402 (e.g., by sensing the voltage across a series resistor R), and an LED's voltage sensor 504 measures a voltage of the LED 402. The LED's control circuitry 506 is coupled to both the LED 402 and its sensors 502, 504, to thereby set an operating current (I) of the LED 402 in response to acquired readings from the LED's current and voltage sensors 502, 504.

In implementing the methods 100 or 300, the control circuitry 506 for at least one of the LEDs 402 may comprise a ramping current source for producing the LED's operating current or reverse current (I) and, as the ramping current source is operated, the control circuitry 506 may variously acquire readings from the LED's voltage sensor 504, at current sensor readings representing a turn-on voltage, a fractional voltage, an operating voltage, or a reverse voltage of the LED 402.

In implementing the method 200, the control circuitry 506 for at least one of the LEDs 402 may add a sinusoid of known frequency (or PRBS) to the operating current of the LED. The control circuitry 506 for the LED 402 may then acquire readings from the LED's sensors 502, 504 at different amplitudes of the sinusoid (or at different points of the PRBS). In one embodiment, the LED's control circuitry 506 may comprise a lock-in amplifier. The lock-in amplifier receives 1) the sinusoid (or PRBS), and 2) an output of the voltage sensor 504 and, in response thereto, outputs desired voltage readings of the LED 402. A lock-in amplifier is useful in that it imparts a level of noise immunity to measured voltages.

The control circuitry 506 for at least one of the LEDs 402 may also comprise an operating current look-up table, indexed by corresponding readings acquired from the LED's current and voltage sensors 502, 504. The values stored in the table may be obtained from known or acquired relationships between 1) the intensity or wavelength ($\lambda$) of light produced by the LED 402, and 2) the turn-on voltage or dynamic impedance of the LED 402.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method, comprising:
   varying an operating current of an LED;
   at one or more values of said operating current, measuring a voltage of the LED; and
   using said measured voltages as feed-forward variables to predict the light intensity of the LED as a function of applied current to set a desired light intensity of the LED.

2. The method of claim 1, wherein a first voltage of the LED is measured at an operating current value of zero.

3. The method of claim 1, wherein a first voltage of the LED is measured at a value of said operating current representing a turn-on voltage of the LED.

4. The method of claim 3, wherein:
   a second voltage of the LED is measured at a value of said operating current representing a first predetermined fraction of a nominal operating value; and
   a third voltage of the LED is measured at a value of said operating current representing a second predetermined fraction of said nominal operating value.

5. The method of claim 1, wherein:
   a first voltage of the LED is measured at a value of said operating current representing a first predetermined fraction of a nominal operating value; and
   a second voltage of the LED is measured at a value of said operating current representing a second predetermined fraction of said nominal operating value.

6. The method of claim 5, wherein using said measured voltages comprises estimating a dynamic impedance of said LED.

7. The method of claim 1, wherein:
   a first voltage of the LED is measured at a value of said operating current representing a majority of a nominal operating value; and
   a second voltage of the LED is measured at said nominal operating value.

8. The method of claim 1, further comprising:
   repeating said current varying and voltage measuring for a plurality of LEDs in a light source; and
   using said measured voltages as feed-forward variables to set light intensities of the LEDs, thereby setting a color point of the light source.

9. The method of claim 8, wherein the light source is an RGB LED light source.

10. The method of claim 8, wherein the light source is a raster scanned display, and wherein said voltage measurements of the LEDs are taken between raster scans of the display.

11. A method, comprising:
    modifying an operating current of an LED in a predetermined manner near its nominal operating value;
    at two or more values of said operating current, measuring a voltage of the LED; and
    using said measured voltages as feed-forward variables to compute an estimated dynamic impedance of the LED to predict the light intensity of the LED as a function of applied current to set a desired light intensity of the LED.

12. The method of claim 11, wherein said operating current of the LED is modified by means of a pilot tone.

13. The method of claim 11, wherein said operating current of the LED is modified by means of a predetermined signal modulated by a pseudo-random bit sequence.

14. The method of claim 11, further comprising:
    repeating said current modification and voltage measuring for a plurality of LEDs in a light source; and
    using said measured voltages as feed-forward variables to set light intensities of the LEDs, thereby setting a color point of the light source.

15. The method of claim 14, wherein said operating currents are modified at frequencies that exceed a user-recognizable flicker point of the light source.

16. A method, comprising:
    applying a reverse current to an LED, subject to a measured voltage of the LED reaching a compliance voltage;
    at the reverse current, measuring a reverse voltage of the LED; and
    using the lesser of the magnitude of the reverse voltage or compliance voltage of the LED as a feed-forward variable to predict the light intensity of the LED as a function of applied current to set a desired light intensity of the LED.

17. The method of claim 16, further comprising:
    repeating said current application and voltage measuring for a plurality of LEDs in a light source; and
    for each LED, using the lesser of the magnitude of its reverse voltage or compliance voltage as a feed-forward variable to set a light intensity of the LED, thereby setting a color point of the light source.

18. An apparatus, comprising:
    a plurality of LEDs of different colors that, when operated, generate a mixed light;
    for at least some of the LEDs, a current sensor to measure an operating current supplied to the LED;
    a voltage sensor to measure a voltage of the LED; and
    control circuitry, coupled to the LED and sensors, to set the operating current of the LED in response to acquired readings from said current and voltage sensors in order to set desired light intensities of the LEDs, the control circuitry being configured to process the acquired readings as feed-forward variables to predict the light intensity of some of the LEDs as a function of applied current to set the desired light intensities of the LEDs.

19. The apparatus of claim 18, wherein the control circuitry for at least one of the LEDs adds a sinusoid of known frequency to said operating current of the LED, and wherein the control circuitry for the LED acquires corresponding readings from said current and voltage sensors at different phases of said sinusoid.

20. The apparatus of claim 19, wherein the control circuitry for the at least one LED comprises a lock-in amplifier, said lock-in amplifier receiving i) the sinusoid, and ii) an output of the voltage sensor and, in response thereto, outputting desired voltage readings of the LED.

21. The apparatus of claim 18, wherein the control circuitry for at least one of the LEDs adds a predetermined signal modulated by a pseudo-random bit sequence (PRBS) to said operating current of the LED, and wherein the control circuitry for the LED acquires corresponding readings from said current and voltage sensors at different points of said PRBS.

22. The apparatus of claim 21, wherein the control circuitry for the at least one LED comprises a lock-in amplifier, said lock-in amplifier receiving i) the PRBS, and ii) an output of the voltage sensor and, in response thereto, outputting desired voltage readings of the LED.

23. The apparatus of claim 18, wherein the control circuitry for at least one of the LEDs comprises a ramping current source and, as the ramping current source is operated, the control circuitry acquires a reading from said voltage sensor at a current sensor reading representing a turn-on voltage of the LED.

24. The apparatus of claim 18, wherein the control circuitry for at least one of the LEDs comprises a ramping current source and, as the ramping current source is operated, the control circuitry acquires first and second voltage readings at first and second current sensor readings of the LED, said readings being used to estimate a dynamic impedance of the LED.

25. The apparatus of claim 18, wherein the control circuitry for at least one of the LEDs comprises a current source to apply a reverse current to the LED, with application of said reverse current being subject to a measured voltage of the LED reaching a compliance voltage; said control circuitry for the at least one LED acquiring a voltage reading of the LED at said reverse current and using the lesser of the magnitude of the reverse voltage or compliance voltage as a feed-forward variable to set a light intensity of the LED, thereby setting a color point of the light source.

26. The apparatus of claim 18, wherein the control circuitry for at least one of the LEDs comprises an operating current look-up table, indexed by corresponding readings acquired from said current and voltage sensors.

* * * * *